United States Patent
Thiele et al.

(10) Patent No.: US 10,726,173 B2
(45) Date of Patent: Jul. 28, 2020

(54) METHOD AND COMPUTER PROGRAM PRODUCT FOR DETERMINING IN-SITU FLUID DISTRIBUTIONS FOR OIL FIELDS USING MATERIAL BALANCE AND STREAMLINE-DERIVED WELL-PAIR VOLUMES

(71) Applicants: Marco Roberto Thiele, San Francisco, CA (US); Roderick Panko Batycky, Calgary (CA)

(72) Inventors: Marco Roberto Thiele, San Francisco, CA (US); Roderick Panko Batycky, Calgary (CA)

(*) Notice: Subject to any disclaimer, the term of this patent is extended or adjusted under 35 U.S.C. 154(b) by 439 days.

(21) Appl. No.: 15/804,891

(22) Filed: Nov. 6, 2017

(65) Prior Publication Data

US 2018/0129762 A1 May 10, 2018

Related U.S. Application Data

(60) Provisional application No. 62/417,661, filed on Nov. 4, 2016.

(51) Int. Cl.
*G06F 30/20* (2020.01)
*E21B 43/12* (2006.01)

(52) U.S. Cl.
CPC .............. *G06F 30/20* (2020.01); *E21B 43/12* (2013.01)

(58) Field of Classification Search
None
See application file for complete search history.

(56) References Cited

U.S. PATENT DOCUMENTS

| | | | | |
|---|---|---|---|---|
| 6,519,531 B1* | 2/2003 | Batycky | ................... | G01V 9/02 702/12 |
| 2004/0015295 A1* | 1/2004 | Bratvedt | ................. | G01P 5/001 702/13 |
| 2006/0224369 A1* | 10/2006 | Yang | ....................... | E21B 43/16 703/10 |
| 2016/0131800 A1* | 5/2016 | Pecher | .................... | G06F 30/23 703/10 |
| 2019/0093469 A1* | 3/2019 | Williams | ................ | E21B 49/00 |

OTHER PUBLICATIONS

Osako, Ichiro et al., "Timestep Selection During Streamline Simulation via Transverse Flux Correction", Feb. 3-5, 2003, SPE Reservoir Simulation Symposium, Society of Petroleum Engineers Inc. (Year: 2003).*

(Continued)

*Primary Examiner* — Cedric Johnson
(74) *Attorney, Agent, or Firm* — Plager Schack LLP

(57) ABSTRACT

A method and system provide automated mapping of fluid distributions in an oil field reservoir. The processes include receiving initial fluid and pressure characteristics of well-pairs in the field. Measurements from sensors detect the amount of fluid injection versus fluid produced for the well-pair during a timestep. The remaining fluid volume for the well-pair may be determined. In an exemplary embodiment, a grid map of well-pairs in the oil field are automatically generated which shows in real-time the remaining volume of fluid for each well-pair in the map. A user may thus manage the production from the oil field with increased efficiency based on the improved accuracy of the mapped data.

10 Claims, 3 Drawing Sheets

(56) References Cited

OTHER PUBLICATIONS

Thiele, M.R. et al., "Polymer Flood Modeling Using Streamlines—Part 1", Sep. 21-24, 2008, SPE Annual Technical Conference and Exhibition, Society of Petroleum Engineers. (Year: 2008).*
Thiele, Marco R. et al., "Streamline-Assisted History Matching", Dec. 9-13, 2007, 9th International Forum on Reservoir Simulation. (Year: 2007).*
Batycky, Rod P. et al., "Mature Flood Surveillance Using Streamlines", May 2016. (Year: 2016).*
Batycky, R.P. et al., "Assisted History Matching of a 1.4-Million-Cell Simulation for Judy Creek 'A' Pool Waterflood/HCMF Using a Streamline-Based Workflow", Nov. 11-14, 2007, SPE Annual Technical Conference and Exhibition, Society of Petroleum Engineers. (Year: 2007).*
Thiele, M.R. et al., "Streamline Simulation for Modern Reservoir-Engineering Workflows", Jan. 2010, Society of Petroleum Engineers. (Year: 2010).*
Izgec, O. et al., "Establishing Injector/Producer Connectivity before Breakthrough during Fluid Injection", Mar. 24-26, 2009, SPE Western Regional Meeting, Society of Petroleum Engineers. (Year: 2009).*

\* cited by examiner

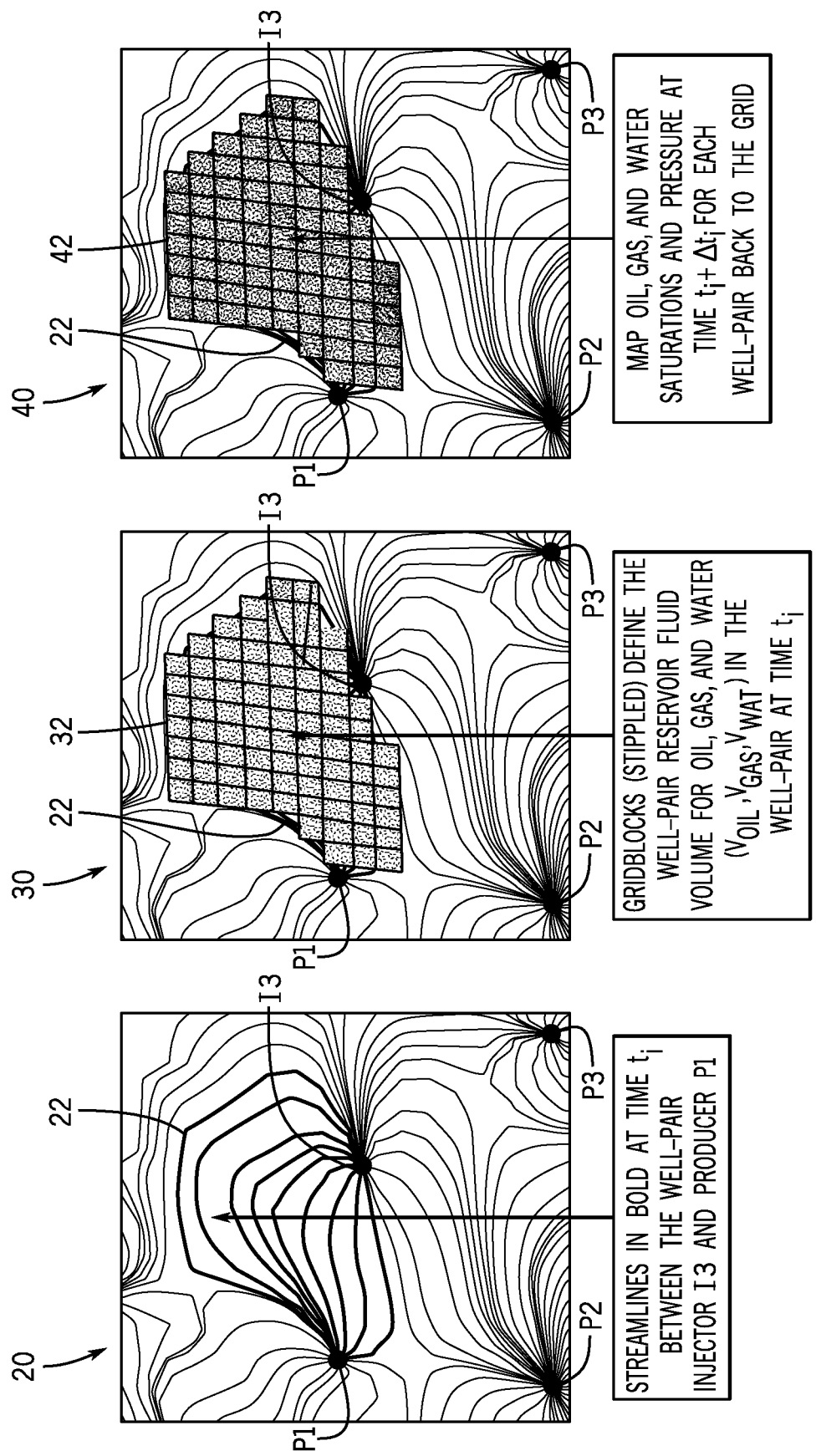

METHOD AND COMPUTER PROGRAM PRODUCT FOR DETERMINING IN-SITU FLUID DISTRIBUTIONS FOR OIL FIELDS USING MATERIAL BALANCE AND STREAMLINE-DERIVED WELL-PAIR VOLUMES

CROSS-REFERENCE TO RELATED APPLICATIONS

This application claims benefit under 35 U.S.C. § 119(e) of U.S. Provisional Application having Ser. No. 62/417,661 filed Nov. 4, 2016, which is hereby incorporated by reference herein in its entirety.

BACKGROUND

The embodiments herein relate generally to oil production, and more particularly, to methods determining in-situ fluid distributions for oil fields using material balance and streamline-derived well-pair volumes.

Recovering oil from a mature flooded reservoir may be costly and prone to diminishing profits when managed inefficiently. Management decisions to efficiently recover oil from a mature flooded reservoir include changing well rates, drilling new wells, and converting existing production wells to injection wells or vice versa. These decisions hinge on an accurate estimate of the spatial distribution of remaining oil, gas, and water fluids, and pressure.

Current approaches use well-pair reservoir volumes that are defined manually and fixed in position for all time. The allocated fraction of injected/produced volumes into each well-pair is also usually assumed fixed in time since these allocations are estimated only from the geometry of the wells relative to each other. Fixed position well-pair reservoir volumes do not account for the dynamic nature of injection/production from an oil field and fail to account for opening new wells or closing old wells over time. The allocation of the fraction of volumes produced/injected in the fixed well-pair volume at the wells is estimated from the well positions only and does not account for well rates.

There is a need for a process that more accurately estimates the current distribution of fluids, and particularly oil in a reservoir.

SUMMARY

In one aspect of the disclosure, a method of determining in-situ fluid distribution of an oil field reservoir comprises receiving by a processor, fluid injection and production rate data from measurement devices located at injector points and producer points in the oil field reservoir; defining active well locations in the reservoir grid model and active historical phase volumes within a timestep duration for the injector points and the producer points in the model; generating a reservoir grid model on an electronic display, the reservoir grid model including a distribution of rock properties, an initial fluid distribution, and an initial pressure at an initial time (time=t0); at a time $t_{i+1}$, determining streamlines between active well locations within a timestep ($\Delta t_i = t_{i+1} - t_i$) duration; for a current timestep duration, identifying a well-pair in the oil field reservoir, the well-pair comprising one of the active injector points and one of the active producer points sharing a set of streamlines starting at said active injector point and ending at said active producer point; determining for the current timestep duration, phase volumes of fluids in-place in the identified well-pair; determining for the current timestep and from the streamlines, the allocated volumes of phases of fluids injected and produced for the well-pair; determining a volume of remaining fluid in the well-pair by applying a material balance calculation to a volume of the well-pair.

In another aspect, a computer program product for determining in-situ fluid distribution of an oil field reservoir comprising a non-transitory computer readable storage medium having computer readable program code embodied therewith. The computer readable program code is configured to: receive by a processor, fluid injection and production rate data from measurement devices located at injector points and producer points in the oil field reservoir; define active well locations in the reservoir grid model and active historical phase volumes within a timestep duration for the injector points and the producer points in the oil field reservoir; generate a reservoir grid model on an electronic display, the reservoir grid model including a distribution of rock properties, an initial fluid distribution, and an initial pressure associated with the active wells at an initial time; determine streamlines between active well locations within the timestep duration; for a current timestep duration, identify a well-pair in the oil field reservoir, the well-pair comprising one of the active injector points and one of the active producer points sharing a set of streamlines starting at said active injector point and ending at said active producer point; determine for the current timestep duration, a phase volume of fluid in-place in the identified well-pair; determine for the current timestep and from the streamlines, allocated volumes of phases of fluids injected and produced for the well-pair; determine a volume of remaining fluids in the well-pair by applying a material balance calculation to a volume of the well-pair; and map the determined volume of remaining fluid in the well-pair back to the reservoir grid model.

BRIEF DESCRIPTION OF THE FIGURES

The detailed description of some embodiments of the invention is made below with reference to the accompanying figures, wherein like numerals represent corresponding parts of the figures.

FIG. 2 is a streamline map of a reservoir field according to embodiments of the subject technology.

FIG. 3 is the streamline map of FIG. 2 showing grid blocks associated according to embodiments of the subject technology.

FIG. 4 is the streamline map of FIG. 3 at the same time point for determining in situ distributions of fluid in the reservoir field at the end of the current time period according to embodiments of the subject technology.

DETAILED DESCRIPTION OF CERTAIN EMBODIMENTS

Broadly, embodiments of the subject technology provide a process and system that determine in situ fluid distributions for oil fields using material balance and streamline-derived well-pair volumes. Aspects of the disclosure below use each well's changing injected/produced volumes and locations over time to define streamlines which in turn define changing well-pair volumes, along with changing allocation of injected and produced volumes associated with each well-pair. As will be appreciated, as no fluid crosses in/out of a streamline-based well-pair reservoir volume, improved accuracy of the remaining fluids calculation is provided. In comparison, prior art methods rely on fixed well-pair reservoir volumes. The material balance calculation to determine the remaining fluids in place in the fixed reservoir volume is an approximation prone to large errors, due to unknown quantities of fluids crossing in/out of the fixed reservoir volume, with the error being on the same order as the well-pair reservoir volume itself.

Embodiments disclosed use digitally generated streamline maps to divide the complete reservoir into smaller well-pair (injector-producer) volumes. The reservoir volume associated with each well-pair may be determined as a function of time reflecting the changing streamlines due to changing injection/production constraints and wells shutting-in or starting-up. Applying material balance at a time-step size $\Delta t$ for each well-pair using the measured (historical) volumes allocated to the injector/producer pair allows for an estimation of the in-place volumes of oil, gas, and water as well as the average pressure associated with each well-pair reservoir volume. Combining all the reservoir well-pair volumes through all time-steps allows the system to reconstruct an estimate of the spatial map of remaining oil, gas, and water fluid saturations and pressures.

As will be further appreciated, generating streamlines to represent extracted well-pair reservoir volumes makes these volumes a function of historical production/injection volumes and geological connectivity. The streamlines accurately allocate the fraction of injected and produced volumes to the well-pair volume. Since there is no flow perpendicular to streamlines there is no flow in or out of the well-pair volume except at the wells, significantly improving the accuracy of the calculation. Finally, the well-pair volumes and associated injection/production volume rates are allowed to change in time accounting for the dynamic nature of the oil field production/injection history, which may be displayed electronically as a tool for one to manage extraction of the reservoir more efficiently.

Figure 1:
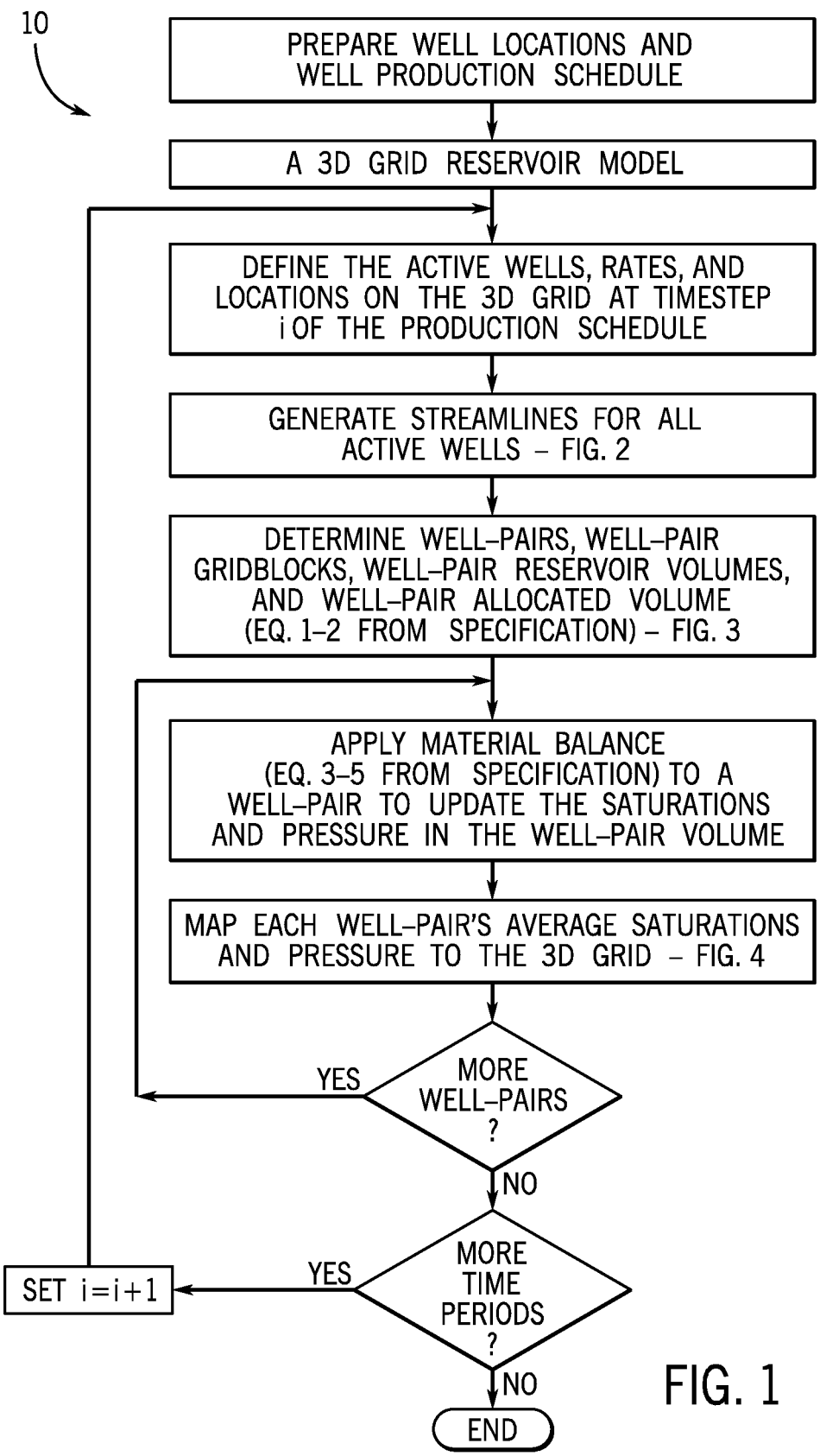
FIG. 1 is a flowchart of a method for determining in situ fluid distributions for oil fields according to embodiments of the subject technology.

Referring now to the Figures, FIG. 1 shows a method 10 for determining the in-situ distribution of fluids in a field reservoir. The method 10 of FIG. 1 may be illustrated by reference to FIGS. 2-4 which show digitally generated streamline maps (20; 30; and 40) of a section of a field under evaluation for in-place fluid volumes. The streamline maps (20; 30; and 40) observe dynamic changes over time of fluids associated with well-pairs on the map. It will be understood that injector and producer points may be associated with measurement devices that provide fluid rate data to a computing device, which is configured to use the data and determine the current distribution of fluids in the field. In the illustrative example shown, the well-pair under evaluation is centered on the injection point I3 in association with producer point P1. However, it will be understood that as the relationship between the well-pair I3-P1 changes, so does the fluid distribution relationship between I3 and producer points P1, P2 and P3. However, for sake of illustration and brevity, the method 10 as applied to the well-pair I3-P1 may be understood to behave in the same manner with any injector point having a relationship with a producer point in the reservoir field and changes for one well-pair may be simultaneously determined for any other connected well-pair.

The method 10 may include the following steps:

Well locations may be prepared (for example, by configuring detection systems to collect and provide data to a computing device). The flowrate history for each well may be collected from a database which may then be used to prepare a well location and well production schedule. Using the well data, a reservoir grid model (either two-dimensional or three dimensional) may be generated which contains the distribution of rock properties and initial fluid distribution and pressure at time $t_0$. The rock properties such as porosity, permeability, net-to-gross ratio, and faults, etc. may be defined for each cell in the grid, in addition to values for oil, water, and gas saturations and pressure. The distribution of saturations and pressures may be assumed to be the initial condition of the reservoir at time $t_0$ before any production/injection takes place. In the following steps, the information on the grid is forwarded in time using discrete time steps, $\Delta t_i$, so as to obtain the remaining three-dimensional saturation/pressure distribution at the end of measured injection and production data.

Thus, the method may continue by defining the active well locations and associated historical phase volumes j (where j is oil, gas, water) for each active injector ($V^{hist}_{j,I,\Delta ti}$) and each active producer ($V^{hist}_{j,P,\Delta ti}$) over the current timestep i. The current timestep period has a time length of $\Delta t_i = t_{i+1} - t_i$. The active well locations and injection/production rates are known at time $t_i$. The rates are assumed to be constant over the time step $\Delta t_i = (t_{i+1} - t_i)$. The size of the time step usually corresponds with measured historical data, but the time step can either be increased or decreased by properly averaging the historically measured injection and production volumes.

Reservoir flow simulation methods may be used to generate streamlines for all the active wells at the timestep i using the defined wells and volumes. An example streamline map for this step is shown in FIG. 2. A reservoir simulator program may be used, subject to the total injection/production rates previously defined above and the initial conditions at time $t_i$ to compute the streamlines covering the grid. The streamlines are assumed to be constant over the time step $\Delta t_i$.

For the current timestep period, identify all well-pairs based on the streamlines. A well-pair is identified as the two wells that share one set of streamlines that start at the injector and end at the producer. A well-pair can be generalized to an injector and aquifer that share one set of streamlines that start at the injector and end in the aquifer and/or a producer and aquifer that share one set of streamlines that start at the aquifer and end at the producer. For each well-pair determine:

The well-pair pressure ($P_{ti}$) and the well-pair volumes $V_{j,ti}$ (where j is oil, gas, water) occupied in all the grid blocks that intersect the streamlines for a given well-pair at the current timestep $t_i$. Grid blocks that are shared between well-pairs may be counted fractionally.

Determine the well-pair allocation factors for the injector ($WAF_I$) and producer ($WAF_P$) using the method outlined in U.S. Pat. No. 6,519,531.

Determine the allocated volume of each fluid phase j injected into the well-pair as, $$V^I_{j,\Delta ti} = WAF_I * V^{hist}_{j,I,\Delta ti} \qquad \text{(Eq. 1).}$$

Determine the allocated volume of each fluid phase j produced from the well-pair as, $$V^P_{j,\Delta ti} = WAF_P * V^{hist}_{j,P,\Delta ti} \qquad \text{(Eq. 2).}$$

An example result is shown in the streamline map of FIG. 2. The computed streamlines are used to define the reservoir volumes associated with the well pair injector I3 and producer P1 in FIG. 3. The well-pair reservoir volume may be determined by taking the intersection of the 3D reservoir grid volume with all the streamlines associated with the well-pair. For the well-pair volume intersection, one can then extract the volumes of oil, water, and gas in place, and the average pressure. The well-pair volume can optionally be controlled by using a time-of-flight (TOF) and drainage-time (DRT) cutoff. Both TOF and DRT are known for each grid block and are extracted from the streamlines. The streamlines also allow the calculation of the well allocation factors, which are the fraction of produced and injected volumes associated with the well-pair.

The defined well-pair volumes may now be assumed to be independent of each other over the time step $\Delta t_i$. For each well-pair volume, the initial fluids in place are known as well as the average pressure and the volumes injected and produced over the time step, $\Delta t_i$.

Next, a material balance calculation may be applied to the well-pair volume which yields new average fluid saturations and average pressure for each well-pair volume at time ti. The pressure and the volume of fluids remaining in the well-pair volume at the end of the timestep may be determined.

The volume of fluids remaining at the end of the timestep are:

$$V^k_{j,ti+\Delta ti} = (\rho_{j,Pti} * V_{j,ti} + \rho_{j,P}^I{}_{ti} * V^I_{j,\Delta ti} - \rho_{j,P}^P{}_{ti} * V^P_{j,\Delta ti})/\rho_{j,P^{k-1}_{ti+\Delta ti}} \quad (Eq.\ 3).$$

The average saturations of the fluids in the well-pair volume remaining at the end of the timestep are:

$$S^k_{j,ti+\Delta ti} = V^k_{j,ti+\Delta ti}/\Sigma_j V^k_{j,ti+\Delta ti} \quad (Eq.\ 4).$$

The average pressure in the well-pair volume at the end of the timestep is: $P^k_{ti+\Delta ti} = P_{ti} - \Sigma_j((\rho_{j,P}^P{}_{ti} * V^P_{j,\Delta ti} - \rho_{j,P}^I{}_{ti} * V^I_{j,\Delta ti})/\rho_{j,P^{k-1}_{ti+\Delta ti}})/(V_{f,ti}(c_r + \Sigma_j c_j * S^k_{j,ti+\Delta ti}))$ (Eq. 5). In the above Eqs. 3-5, k is an iteration index required if either the fluid compressibility ($c_j$) or rock compressibility ($c_r$) is not zero. If both compressibilities are zero then the system is assumed to be incompressible and (Eq. 5) is not needed. $\rho_{j,Pti}$ is the density of fluid j at a pressure P and $V_{f,ti}$ is the total well pair volume.

The average saturations and pressure for the well-pair volume may be mapped back to the reservoir grid blocks for the identified well-pair. If there are more well-pairs in the field that need evaluating, the method repeats the material balance calculation to each successively evaluated well-pair's volume. The process maps updated saturations and pressure for each well-pair back to the underlying 3D grid until no well-pairs remain unprocessed. When all well-pairs have been processed, saturations and pressure distributions at time ti for the reservoir will have been updated to $t_{i+1}$.

Otherwise if $t_i$=final time then there are no more time steps so the process may end. Otherwise advance to the next timestep (i=i+1), and reiterate the process starting back at the step of defining active wells, rates, and locations on the grid model.

Figure 5:
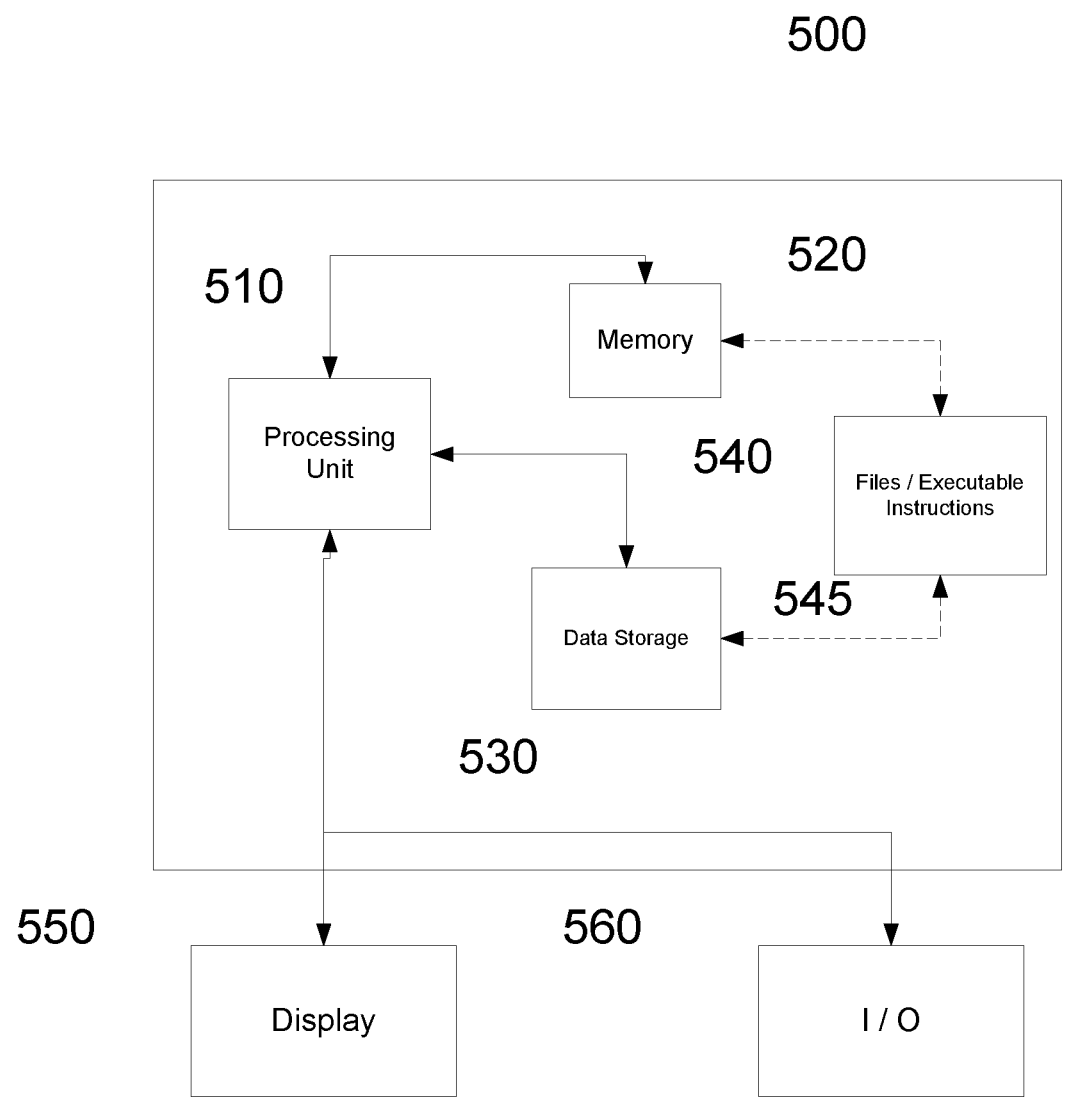
FIG. 5 is a block diagram of a computing device according to embodiments of the subject technology.

Referring now to FIG. 5, a schematic of an example of a computing device 500 is shown. The computing device 500 may be for example, a computer system or a computer server. As will be appreciated, some aspects of the embodiments disclosed above may turn the computing device 500 into a special purpose computer system. For example, in the role of a host server, the computing device 500 may implement for example the functions of storing oil field and well data. More particular to this disclosure, as a host server, the computing device 500 may receive well data from sensors and use the data in the processes described above to determine the in-situ distribution of fluids in the reservoir field.

In the role of a user device, the computing device 500 is generally not a server but may instead be desktop computers, tablet or laptop computers, all-in-one computer stations, a mobile computing device (for example, a smart phone, smart wearable devices (glasses, jewelry, watches, ear wear, etc.), or programmable electronics displaying field data including for example, the streamlines maps with grids described above.

The components of the tablet or laptop computers, may include, but are not limited to, one or more processors or processing units 510, a system memory 520, data storage 530, a computer program product 540 having a set of program modules 545 including files and executable instructions, and a bus system that couples various system components including the system memory 520 to the processor (s) 510.

The computing device 500 may be described in the general context of computer system executable instructions, such as the program modules 545 which represent a software embodiment of the system and processes described generally above with respect to FIGS. 1 and 2-4. The program modules 545 generally carry out the functions and/or methodologies of embodiments as described above. The computing device 500 may typically include a variety of computer system readable media. Such media could be chosen from any available media that is accessible by the computing device 500, including non-transitory, volatile and non-volatile media, removable and non-removable media for use by or in connection with an instruction execution system, apparatus, or device. A computer readable storage medium may be, for example, but not limited to, an electronic, magnetic, optical, electromagnetic, infrared, or semiconductor system, apparatus, or device, or any suitable combination of the foregoing. The system memory 520 could include one or more computer system readable media in the form of volatile memory, such as a random-access memory (RAM) and/or a cache memory. By way of example only, the data storage system 530 may read from and write to a non-removable, non-volatile magnetic media device. The system memory 520 may include at least one program product 540 having a set (e.g., at least one) of program modules 545 that are configured to carry out the functions of embodiments of the invention in the form of computer executable instructions. The program product/utility 540, having a set (at least one) of program modules 545, may be stored in the system memory 520 by way of example, and not limitation, as an operating system, one or more application programs, other program modules, and program data.

The computing device 500 may communicate with one or more external devices including for example, an electronic display 550 which may in some embodiments be configured for tactile response as in a touch screen display. User input into the display 550 may be registered at the processor 510 and processed accordingly. Other devices may enable the computing device 500 to communicate with one or more other computing devices, either by hardwire or wirelessly. Such communication can occur via Input/Output (I/O) interfaces/ports 560. In some embodiments, the I/O interfaces/ports 560 may be specially configured to handle aspects of the embodiments described herein converting the computing device 500 into a special purpose machine. For example, the computing device 500 may be a workstation or printer that is configured to read, process, and print out data in the form of streamline maps.

The computing device 500, through the I/O interface/ports 560, may communicate with one or more networks such as a local area network (LAN), a general wide area network (WAN), and/or a public network (e.g., the Internet) via a network adapter as is commonly known in the art. Each of the operating system, one or more application programs, other program modules, and program data or some combination thereof, may include an implementation of a networking environment. In some embodiments, the computing device 500 may be a cloud computing node connected to a cloud computing network (not shown). The computer computing device 500 may be practiced in distributed cloud computing environments where tasks are performed by remote processing devices that are linked through a communications network. In a distributed cloud computing environment, program modules may be located in both local and remote computer system storage media including memory storage devices.

As will be appreciated by one skilled in the art, aspects of the disclosed invention may be embodied as a system, method or process, or computer program product. Accordingly, aspects of the disclosed invention may take the form of an entirely hardware embodiment, an entirely software embodiment (including firmware, resident software, microcode, etc.) or an embodiment combining software and hardware aspects that may all generally be referred to herein as a "module", "circuit", or "system." Furthermore, aspects of the disclosed invention may take the form of a computer program product embodied in one or more computer readable media having computer readable program code embodied thereon. In some embodiments, the output of the computer program product provides an electronic user interface on the display 550 which may be controlled via direct contact with the display 550 or via the I/O interfaces 560.

Aspects of the disclosed invention are described above with reference to block diagrams of methods, apparatus (systems) and computer program products according to embodiments of the invention. It will be understood that each block of the block diagrams, and combinations of blocks in the flowchart illustrations and/or block diagrams, can be implemented by computer program instructions. These computer program instructions may be provided to the processor 510 of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks in the figures.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A method of determining in-situ fluid distribution of an oil field reservoir, comprising:
    receiving by a processor, fluid injection and production rate data from measurement devices located at injector points and producer points in the oil field reservoir;
    defining active well locations in a reservoir grid model and active historical phase volumes within a timestep duration for the injector points and the producer points in the oil field reservoir;
    generating the reservoir grid model on an electronic display, the reservoir grid model including a distribution of rock properties, an initial fluid distribution, and an initial pressure at an initial time (time=$t_0$);
    at a time $t_{i+1}$, determining streamlines between active well locations within a timestep ($\Delta t_i = t_{i+1} - t_i$) duration;
    for a current timestep duration, identifying a well-pair in the oil field reservoir, the well-pair comprising an active injector point and an active producer point sharing a set of streamlines starting at said active injector point and ending at said active producer point;
    determining for the current timestep duration, phase volumes of fluids in-place in the identified well-pair;
    determining for the current timestep duration and from the streamlines, allocated volumes of phases of fluids injected and produced for the well-pair;
    determining a volume of remaining fluid in the well-pair by applying a material balance calculation to a volume of the well-pair; and
    mapping the determined volume of remaining fluid in the well-pair back to the reservoir grid model.

2. The method of claim 1, further comprising:
    determining a well-pair pressure for the identified well-pair, at the start of the current timestep duration;
    determine an average pressure by applying an additional material balance calculation for the identified well-pair at the end of the current timestep duration; and
    mapping the determined average well-pair pressure to the well-pair on the reservoir grid model.

3. The method of claim 2, further comprising:
    determining an average saturation of remaining fluid in the well-pair at the end of the current timestep duration; and
    mapping the determined average saturation of remaining fluid in the well-pair to the well-pair on the reservoir grid model.

4. The method of claim 1, further comprising:
    determining the volumes of fluids in-place in the well-pair at the start of the current timestep;
    determining a volume of fluid injected into the active injector point for the current timestep duration;
    determining a volume of fluid produced from the active producer point for the current timestep duration; and
    determining the volume of remaining fluid in the well-pair based on the determined volume of fluid in-place at the start of the current timestep, the determined volume of fluid injected and the determined volume of fluid produced for the current timestep duration.

5. The method of claim 4, further comprising:
    identifying a plurality of well-pairs in the oil field reservoir;
    determining the remaining volume of fluid for every identified one of the plurality of well-pairs;
    mapping the remaining volume of fluid for every identified one of the plurality of well-pairs back to the reservoir grid model; and
    updating the mapped remaining volume of fluid over time.

6. A computer program product for determining in-situ fluid distribution of an oil field reservoir, the computer program product comprising a non-transitory computer readable storage medium having computer readable program code embodied therewith, the computer readable program code being configured to:
    receive by a processor, fluid injection and production rate data from measurement devices located at injector points and producer points in the oil field reservoir;
    define active well locations in a reservoir grid model and active historical phase volumes within a timestep duration for the injector points and the producer points in the oil field reservoir;

generate the reservoir grid model on an electronic display, the reservoir grid model including a distribution of rock properties, an initial fluid distribution, and an initial pressure associated with the active wells at an initial time;

determine streamlines between active well locations within the timestep duration;

for a current timestep duration, identify a well-pair in the oil field reservoir, the well-pair comprising an active injector point and an active producer point sharing a set of streamlines starting at said active injector point and ending at said active producer point;

determine for the current timestep duration, a phase volume of fluid in-place in the identified well-pair;

determine for the current timestep duration and from the streamlines, allocated volumes of phases of fluids injected and produced for the well-pair;

determine a volume of remaining fluids in the well-pair by applying a material balance calculation to a volume of the well-pair; and map the determined volume of remaining fluid in the well-pair back to the reservoir grid model.

7. The computer program product of claim 6, further comprising computer readable code configured to:

determine a well-pair pressure for identified well-pair, at a start of the current timestep duration;

determine an average pressure by applying a material balance calculation for the identified well-pair at the end of the current timestep duration; and map the determined average well-pair pressure to the well-pair on the reservoir grid model.

8. The computer program product of claim 7, further comprising computer readable code configured to:

determine an average saturation of remaining fluid in the well-pair at the end of the current timestep duration; and map the determined average saturation of remaining fluid in the well-pair pressure to the well-pair on the reservoir grid model.

9. The computer program product of claim 6, further comprising computer readable code configured to:

determine the volumes of fluids in-place in the well-pair at the start of the current timestep;

determine a volume of fluid injected into the active injector point for the current timestep duration;

determine a volume of fluid produced from the active producer point for the current timestep duration; and determine the volume of remaining fluid in the well-pair based on the determined volume of fluids in-place at the start of the current timestep, the determined volume of fluid injected and the determined volume of fluid produced for the current timestep duration.

10. The computer program product of claim 9, further comprising computer readable code configured to:

identify a plurality of well-pairs in the oil field reservoir;

determine the remaining volume of fluid for every identified one of the plurality of well-pairs;

map the remaining volume of fluid for every identified one of the plurality of well-pairs back to the reservoir grid model; and update the mapped remaining volume of fluid over time.

* * * * *